United States Patent [19]
Dobrovolny et al.

[11] Patent Number: 6,035,185
[45] Date of Patent: Mar. 7, 2000

[54] SELECTIVE RF CIRCUIT WITH VARACTOR TUNED BANDPASS SWITCHED BANDPASS FILTERS

[75] Inventors: Pierre Dobrovolny, North Riverside; James J. Wolford, Streamwood, both of Ill.

[73] Assignee: Zenith Electronics Corporation, Glenview, Ill.

[21] Appl. No.: 08/889,672

[22] Filed: Jul. 8, 1997

Related U.S. Application Data

[63] Continuation-in-part of application No. 08/516,031, Aug. 17, 1995, Pat. No. 5,752,179.

[51] Int. Cl.$^7$ .................................................. H04B 1/06
[52] U.S. Cl. ..................... 455/266; 455/188.1; 455/290; 334/15
[58] Field of Search ............................. 455/168.1, 169.1, 455/169.2, 178.1, 179.1, 180.1, 180.2, 180.3, 180.4, 188.1, 188.2, 189.1, 190.1, 191.2, 280, 282, 284, 290, 266, 339–340, 193.1–193.3; 333/174, 177, 175, 176, 129, 132; 334/15, 47, 55

[56] References Cited

U.S. PATENT DOCUMENTS

| 5,285,179 | 2/1994 | Wignot et al. .............................. 334/15 |
| 5,483,209 | 1/1996 | Takayama .............................. 455/188.1 |

*Primary Examiner*—Reinhard J. Eisenzopf
*Assistant Examiner*—Sam Bhattacharya

[57] ABSTRACT

A selective RF circuit for a double conversion tuner includes three double tuned bandpass circuits, each of which is tunable over approximately one-third of the tuning range. Switching diodes are used at the input and the output of each of the bandpass sections for selectively activating one of the bandpass sections and deactivating the remaining ones in response to a bandswitching signal. Operational amplifiers or other devices supply the input and output switching diodes by providing a current sink for the active bandpass and current sources for the inactive bandpasses.

6 Claims, 3 Drawing Sheets

SELECTIVE RF CIRCUIT WITH VARACTOR TUNED BANDPASS SWITCHED BANDPASS FILTERS

CROSS REFERENCE TO RELATED PATENT APPLICATION

This application is a Continuation-In-Part of application Ser. No. 08/516,031, filed Aug. 17, 1995, entitled Selective RF Circuit With Varactor Tuned and Switched Bandpass Filters, now U.S. Pat. No. 5,752,179, issued May 12, 1998.

BACKGROUND OF THE INVENTION AND PRIOR ART

This invention relates generally to RF input circuits and particularly to an RF input circuit for use in a double conversion tuner for digital television signals such as that in the proposed Zenith/AT&T Digital Spectrum Compatible High Definition Television System (DSC/HDTV). U.S. Pat. No. 4,435,841, assigned to Zenith Electronics Corporation, is concerned with reducing second and third order intermodulation distortion in a double conversion tuning system. Essentially a series of capacitors and inductors is selectively switched to exhibit high pass and low pass characteristics over the tuning band for controlling intermodulation distortion by restricting the bandwidth of incoming signals as the various channels are tuned. U.S. Pat. No. 4,571,560, assigned to Zenith Electronics Corporation discloses a switched bandpass filter arrangement for a double conversion tuner. Each bandpass filter section includes a switching diode rendering the filter section active for passing, or inactive for suppressing, the band of frequencies to which it is tuned. Portions of the inactive bandpass filter sections contribute to developing frequency responses with notches at frequencies outside of the pass band of the active filter section. Thus some elements of the inactive bandpass filter sections are used with the active filter sections for improving the band rejection slopes. U.S. Pat. No. 5,311,318, assigned to Zenith Electronics Corporation discloses a double conversion tuner in which the first local oscillator is controlled by a low noise phase locked loop supplied with a first digital number and the second local oscillator is controlled by a second digital number that compensates the frequency of the second local oscillator for any deviation of the first IF frequency from a predetermined value. These patents provide the relevant background for the present invention.

With the advent of digital transmission systems for television signals and HDTV there is a need to improve the television tuner performance beyond that which is currently acceptable with NTSC transmissions. in particular, the tuner selectivity must be addressed. It is desirable to widen and improve the frequency response within a 6 MHz TV channel and to minimize variations in frequency response from channel to channel. It is also expected that HDTV transmission will be capable of utilizing the so-called taboo channels. With standard single conversion varactor tuned TV tuners, the above requirements are in opposition. A double conversion tuner (used for years by the cable TV industry) can yield some desired improvements but has other problems related to its wide band RF input. Unlike a single conversion tuner that has a low IF frequency which allows, to some extent, RF and local oscillator tracking, a state of the art double conversion tuner has a relatively high first IF frequency (about 1 GHz). Recent developments in dedicated microprocessors, D/A converters, electronic switching circuits and circuit integration make it possible to provide a double conversion tuner with a microprocessor controlled front end for RF selectivity, which is the subject of this invention.

OBJECTS OF THE INVENTION

A principal object of the invention is to provide a novel seleceive RF circuit.

Another object of the invention is to provide a selective RF circuit for a double conversion double tuned bandpass tuning system usable in a digital transmission system.

A further object of the invention is to provide a digitally controllable selective RF tuning system.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
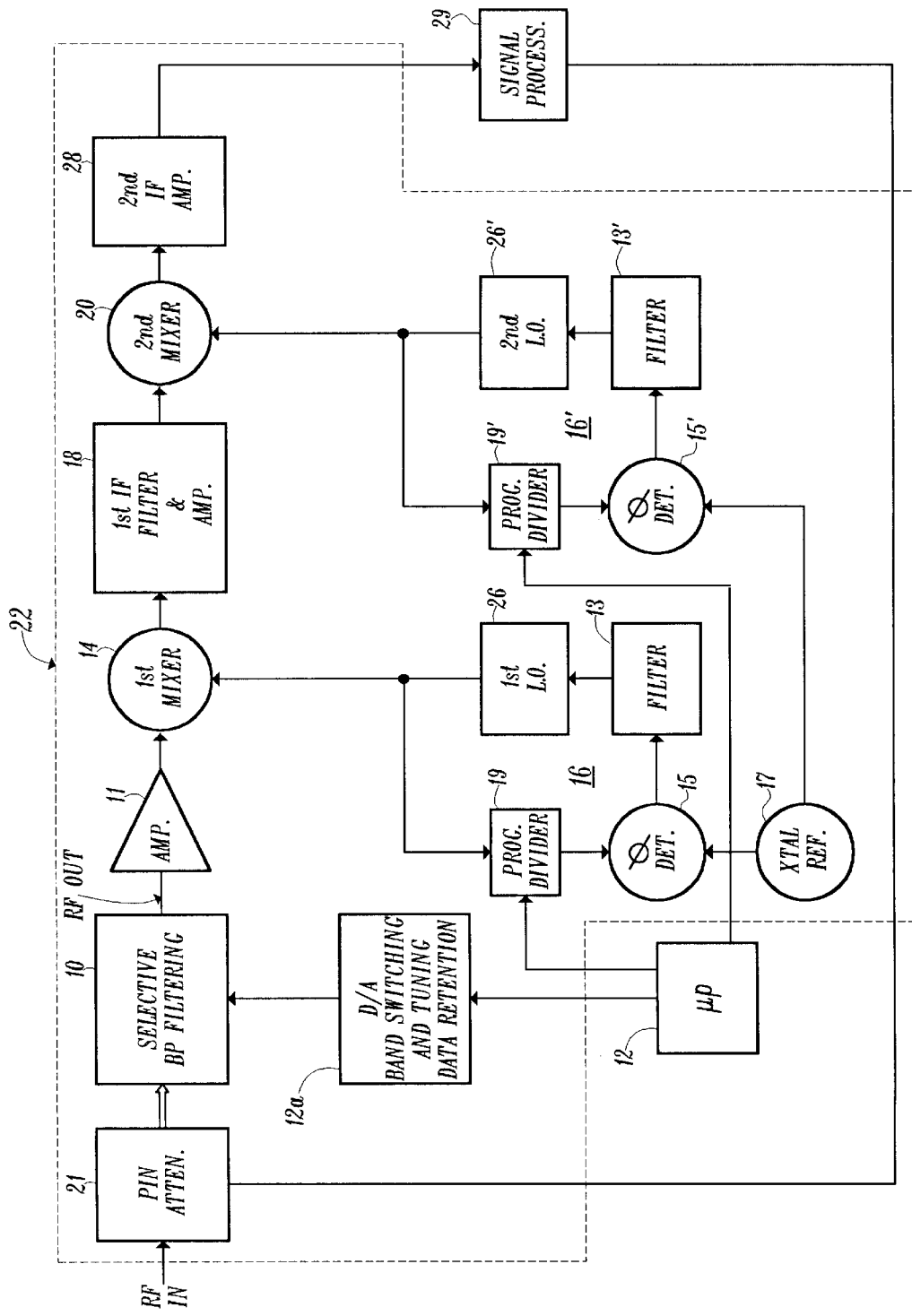
FIG. 1 is a partial block diagram of a double conversion tuner constructed in accordance with the invention.

FIG. 1 shows a tuner module 22, controlled by a microprocessor 12, for supplying an output signal to a signal processing circuit 29. An RF input signal, which may either be a source of cable-connected or over-the-air DTV or HDTV signals of 54 MHz–806 MHz, is supplied through a PIN diode attenuator 21 to a block 10 labelled selective bandpass filtering. The RF output of block 10 is supplied to an amplifier 11, and thence to a first mixer 14 that is supplied with a signal from a first local oscillator 26 in a first phase locked loop synthesizer 16. The output of first mixer 14 is, for example, a 920 MHz IF signal that is applied to a first IF filter and amplifier 18. The signal from first IF amplifier 18 is applied to a second mixer 20, which is also supplied with a signal from a second local oscillator 26' (in a second phase locked loop 16') to produce a second IF signal frequency of 44 MHz. This second IF signal is applied to a second IF amplifier 28, the output of which is applied to signal processing circuit 29, which includes further circuitry (not shown) for processing television signals. A microprocessor 12 controls block 10 (by means of a controller 12a) and synthesizers 16 and 16', and retrieves all necessary tuning data from the EEPROM memory (not shown in this figure) in controller 12a.

Synthesizer 16 includes a low-phase-noise, phase locked loop for controlling first local oscillator 26. To that end, a crystal reference 17, a phase detector 15 and a filter 13 are provided. Microprocessor 12 supplies a first digital number to a programmable divider 19. The output of first local oscillator 26 is coupled to programmable divider 19 which supplies an input to phase detector 15. Because of the coarse tuning increments of the first local oscillator signal, the first IF signal frequency may vary a fraction of a MHz from the desired value. Microprocessor 12 also supplies a second digital number to a programmable divider 19' in second synthesizer 16'. Second synthesizer 16' is similar to first synthesizer 16 and includes a low-phase-noise, phase locked loop for controlling second local oscillator 26'. Signals from crystal reference 17 and from programmable divider 19' are supplied to phase detector 15' which controls second local oscillator 26' through a filter 13'. The output of second local oscillator 26' is coupled to programmable divider 19'. It will be appreciated that although a double conversion tuner is shown, for purposes of this invention, any type of tuner can be used.

Figure 2:
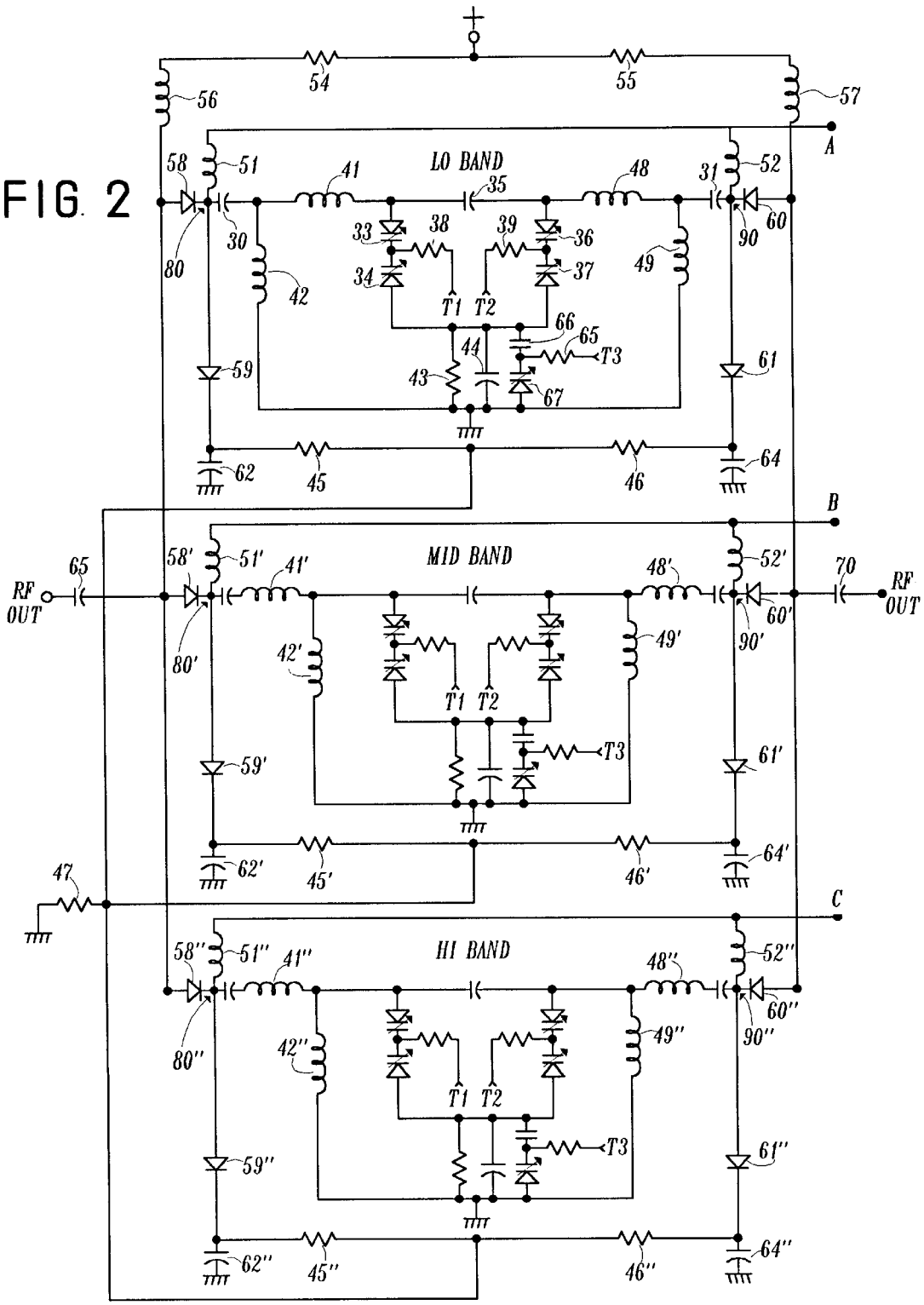
FIG. 2 is a schematic diagram of the selectively switched and varactor tuned bandpass circuits in the tuner of FIG. 1.
Figure 3:
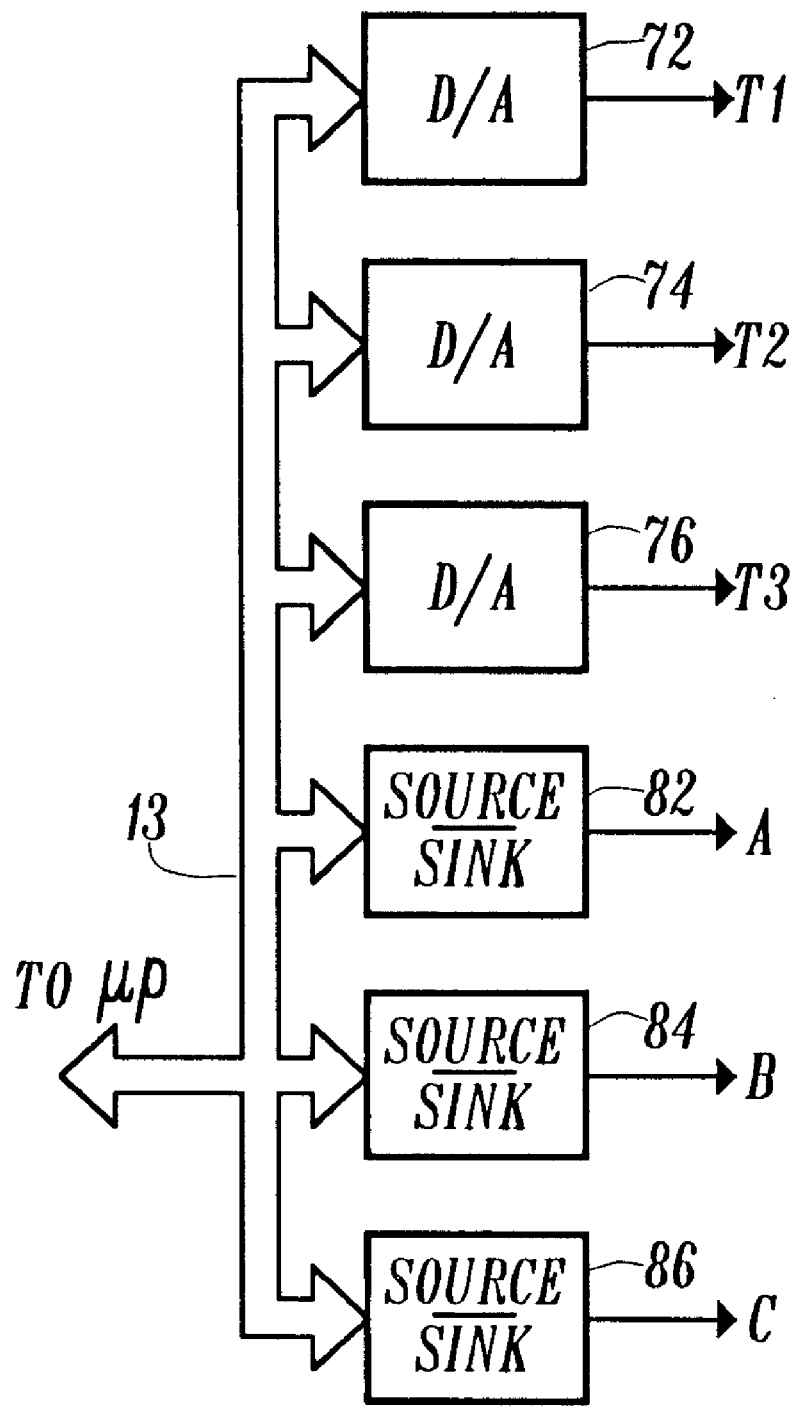
FIG. 3 illustrates an exemplary arrangement for controlling the varactors and switching diodes and for providing means for tuning data retention in the circuits of FIG. 2.

FIG. 2 represents block 10 of FIG. 1. Three double tuned, varactor tuned bandpass circuits (a Lo Band, a Mid Band and a Hi Band) are connected between the RF input and the RF output. A typical frequency distribution for the three bandpass filters is: Lo Band, approximately 54–133 MHz; Mid Band, approximately 133–327 MHz; and Hi Band, approximately 327–806 MHz. Each double tuned circuit is provided with a common variable input section tuning voltage T1, a common variable output section tuning voltage T2, a common variable coupling factor adjustment voltage T3 and a separate switching voltage. The tuning voltages T1 and T2, if controlled independently, provide a suitable arrangement for an automated computerized alignment process. The third independent voltage T3 provides the means for maintaining an optimized bandpass response. The individual switching voltages are ultimately generated by a corresponding number of operational amplifiers or other devices capable of providing both current sourcing and sinking. The action is controlled by microprocessor 12, through controller 12a, via a control bus 13 (FIG. 3).

With particular reference to the Lo Band bandpass circuit, tuning voltage T1 is coupled from controller 12a, through an RF decoupling resistor 38, to the junction of a pair of varactor tuning diodes 33,34. Similarly, tuning voltage T2 is coupled from controller 12a, through an RF decoupling resistor 39, to the junction of a pair of varactor tuning diodes 36,37. A small series capacitor 35 is connected between the anodes of varactor diodes 33 and 36. The anodes of varactor diodes 34 and 37 are connected (both for AC and DC) to a ground potential through the parallel combination of a resistor 43 and a capacitor 44. The common coupling factor tuning voltage T3 is supplied from controller 12 through an RF decoupling resistor 65 to the junction of a capacitor 66 and a varactor diode 67, which are connected in parallel with resistor 43 and capacitor 44. The input terminal 80 of the Lo Band circuit is connected through a capacitor 30 and an inductor 41 to the junction of capacitor 35 and varactor diode 33 and the Lo Band output terminal 90 is similarly connected through a capacitor 31 and an inductor 48 to the junction of capacitor 35 and varactor diode 36. The junction of capacitor 30 and inductor 41 is connected to ground through an inductor 42 and the junction of capacitor 31 and inductor 48 is coupled to ground through an inductor 49.

The operation of the Lo Band bandpass circuit is such that, ideally, a wider than 6 MHz frequency band is tracked across the 54 to 133 MHz bandwidth of the Lo Band circuit as a function of variations in the tuning and coupling voltages T1, T2 and T3. As will be seen, there are diode switches for activating one of the Lo, Mid and Hi Band bandpass circuits and deactivating the other two so that each bandpass circuit is used only over a restricted frequency range. The essential feature of the switching circuits is that the diodes are turned ON and OFF completely (to preclude crosstalk) without requiring a two polarity power supply or generating an unnecessary power dissipation.

The diode switching circuits switch both the inputs and the outputs of each of the bandpass circuits and the switching diodes are driven from operational amplifiers or other devices that provide both a source and a sink for the switching diode currents. The switching circuit for the Lo Band bandpass includes a source of positive voltage that is connected to the junction of a pair of resistors 54 and 55. Resistor 54 is connected through an inductor 56 to the anode of a series connected switching diode 58 that has its cathode connected to Lo Band input terminal 80, and resistor 55 is connected through an inductor 57 to the anode of a series connected switching diode 60 that has its cathode connected to the Lo Band output terminal 90. A shunt connected switching diode 59 has its anode connected to the Lo Band input terminal 80 and its cathode connected (AC wise) to ground through a capacitor 62 on the input side and a shunt connected switching diode 61 has its anode connected to output terminal 90 and its cathode connected (AC wise) to ground through a capacitor 64 on the output side. The ungrounded terminals of capacitors 62 and 64 are connected together through a pair of low value resistors 45 and 46, the junction of which is connected to ground through a resistor 47, which is common to all of the switching circuits for the bandpass filters and which has a much higher value than resistors 45 and 46. Controller 12a supplies either a high logic (source) or a low logic (sink) voltage at terminal A. The voltage is supplied through an inductor 51 to Lo Band input terminal 80 and through an inductor 52 to Lo Band output terminal 90.

In operation, a high logic voltage at terminal A forward biases shunt connected diodes 59 and 61, rendering them conductive, and resulting in a voltage across resistor 47 that is close to the positive supply voltage. This voltage, in turn, enhances the reverse biasing of the shunt connected diodes in the other filters, while reverse biasing series connected diodes 58 and 60, rendering them nonconductive. Therefore the Lo Band bandpass section is rendered inactive. On the other hand, a low logic voltage at terminal A forward biases series connected diodes 58 and 60, rendering them conductive. In the process the voltage drop across resistors 54, 55 is increased which enhances the reverse biasing of all inactive series connected filter diodes and reverse biases shunt connected diodes 59 and 61, causing them to become nonconductive. Under this condition, the Lo Band bandpass section is rendered active.

The RF input signal is applied to the anode of series connected diode 58 (and to the anodes of commonly connected series diodes 58' and 58") through a capacitor 65 and the RF output signal is taken from the anode of series connected diode 60 (and the commonly connected anodes of series diodes 60' and 60") through a capacitor 70.

The Mid Band and Hi Band bandpass sections are basically the same in their schematic layout. They obviously differ in component values since the Mid Band circuit is tuned between 133 and 327 MHz and the Hi Band circuit is tuned between 327 and 806 MHz. Also, the input and output inductors differ in their connections in these circuits. In the Lo Band circuit, inductors 42 and 49 are shunted across the input terminal end and output terminal end of inductors 41 and 48, respectively. In the Mid Band and in the Hi Band circuits, the corresponding input inductors 42' and 42" are shunted across the opposite ends of inductors 41' and 41", respectively. Similarly, the corresponding output inductors 49' and 49" are shunted across the opposite ends of inductors 48' and 48", respectively.

The diode switching circuits for the Mid Band and Hi Band circuits are identical to that for the Lo Band circuit with input series connected diodes 58' and 58" corresponding to diode 58, input shunt connected diodes 59' and 59" corresponding to diode 59, output series connected diodes 60' and 60" corresponding to diode 60 and output shunt connected diodes 61' and 61" corresponding to diode 61. Similarly, resistors 45' and 46' are connected to the junctions of diodes 59' and 61' and their respective capacitors 62' and 64' and, in turn, have their respective junctions connected to common resistor 47. The same is true for the Hi Band circuit which includes similarly connected resistors 45" and 46" and capacitors 62" and 64". Terminals B and C are supplied from controller 12a which supplies source/sink current through inductors 51' and 51" and inductors 52' and 52" to terminals 80', 80" and 90', 90", respectively.

It will be appreciated that when any of the controller 12a outputs A, B, C is low (current sink) the remaining outputs are high (current source) so that only one of the bandpass filters is rendered active and all others are rendered inactive. The applied RF signal at the junction of the anodes of series connected switching diodes 58, 58' and 58" is processed by whichever one of the bandpass filters is active and is taken from the anode of the active one of series connected switching diodes 60, 60' and 60". Controller 12a supplies signals for controlling their operation such that the various bandpass circuits are rendered active over the appropriate frequency bands and rendered inactive for all other frequency bands. The controller also supplies the tuning voltages T1, T2 and T3, which effectively causes the bandpass filters to track the incoming tuned RF signal over their respective ranges.

Those skilled in the art will appreciate that the system is not limited to three bandpass filters, but may be extended to a greater number (or reduced to only two in appropriate situations). Since only one bandpass is active at any time, each of resistors 54 and 55 is fixed by the diode current demand of the single active switching diode it supplies. On the other hand, the value of resistor 47 is selected as a function of the diode current demand and the number of shunt connected diodes that are driven conductive in the non active bandpass circuits. Hence the value of resistor 47 is a function of the number of separate bandpass circuits employed.

FIG. 3 illustrates one example of the controller 12a in FIG. 1. The controller generates the necessary tuning voltages T1, T2 and T3 and the bandswitching source/sink currents provided at terminals A, B, and C. Controller 12a also provides tuning data retention by means of an EEPROM memory circuit 12b. In this arrangement all function blocks of controller 12a are essentially individual integrated circuits. Three integrated circuit D/As 72, 74 and 76 generate the analog tuning voltages T1, T2 and the analog coupling voltage T3. D/A 72 provides the tuning voltage T1 for the active input circuit, D/A 74 provides tuning voltage T2 for the active output circuit and D/A provides adjustment voltage T3 between the active input and output circuits. Three current source/sink generator integrated circuits 82, 84 and 86 control the bandswitching action and EEPROM 12b retains, in digital form, the coded data necessary for tuning and switching all of these circuits in response to the selected channel number. Those skilled in the art will appreciate that there are different levels of circuit integration possible, the highest being as single integrated circuit with three analog output pins for T1, T2 and T3, three source/sink output pins and a number of pins commensurate with the interconnecting bus communications.

It is recognized that numerous modifications and changes to the described embodiment of the invention will occur to those skilled in the art without departing from its true spirit and scope. The invention is to be limited only as defined in the claims.

What is claimed is:

1. A selective RF circuit for a tuner operating in a tuning band comprising:

a plurality of tunable doable tuned bandpass sections, each including a varactor tuning diode, and each having an input and an output and each being tunable over a corresponding portion of said tuning band;

switching diode means connected to said input and said output of each of said bandpass sections;

means for operating said switching diode means for selectively coupling said input and said output of each of said plurality of double tuned bandpass sections for tuning a selected one of said channel signals, said operating means sourcing and sinking said switching diode means to provide a large reverse bias when said switching diode means are in an off condition and minimum power dissipation when said switching diode means are turned on; and tuning voltage means changing the capacitance of said varactor tuning diodes for tuning said double tuned bandpass sections for tracking said selected one of said channel signals.

2. The circuit of claim 1 wherein said operating means comprise operational amplifiers.

3. A selective RF circuit for a tuner comprising:

a plurality of tunable double tuned bandpass sections, each having a varactor diode and an input and an output, and each being tunable over a corresponding portion of said tuning band;

switching diode means connected to said input and said output of each of said bandpass sections operational amplifier means for driving said switching diode means for selectively coupling said input and said output of each of said three double tuned bandpass sections for selectively tuning one of said channel signals, said operational amplifier means sourcing and sinking said switching diodes to provide a large reverse bias when said switching diodes are cutoff and minimum power dissipation when said switching diodes are turned on; and tuning voltage means for changing the capacitance of said varactor diode to tune said double tuned bandpass sections for tracking said selected channel signals.

4. A selective RF circuit for a double conversion tuner operating in a tuning band comprising:

three tunable double tuned bandpass sections, each including a varactor tuning diode, and each having an input and an output and each being tunable over approximately one-third of said tuning band;

switching diode means connected to said input and said output of each of said bandpass sections;

means for operating said switching diode means for selectively coupling said input and said output of each of said three double tuned bandpass sections for tuning a selected one of said channel signals, said operating means sourcing and sinking said switching diode means to provide a large reverse bias when said switching diode means are in an off condition and minimum power dissipation when said switching diode means are turned on; and tuning voltage means changing the capacitance of said varactor tuning diodes for tuning said double tuned bandpass sections for tracking said selected one of said channel signals.

5. The circuit of claim 4 wherein said operating means comprise operational amplifiers.

6. A selective RF circuit for a double conversion tuner comprising:

three tunable double tuned bandpass sections, each having a varactor diode and an input and an output, and each being tunable over approximately one-third of said tuning band;

switching diode means connected to said input and said output of each of said bandpass sections operational amplifier means for driving said switching diode means for selectively coupling said input and said output of each of said three double tuned bandpass sections for selectively tuning one of said channel signals, said operational amplifier means sourcing and sinking said switching diodes to provide a large reverse bias when said switching diodes are cutoff and minimum power dissipation when said switching diodes are turned on; and tuning voltage means for changing the capacitance of said varactor diode to tune said double tuned bandpass sections for tracking said selected channel signals.

* * * * *